(12) United States Patent
Mochizuki et al.

(10) Patent No.: US 11,714,119 B2
(45) Date of Patent: Aug. 1, 2023

(54) EARTH FAULT DETECTION APPARATUS

(71) Applicant: Yazaki Corporation, Tokyo (JP)

(72) Inventors: Yasuyuki Mochizuki, Makinohara (JP); Norio Sudo, Makinohara (JP); Haruhiko Yoshida, Makinohara (JP); Ryosuke Arigaya, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 17/750,834

(22) Filed: May 23, 2022

(65) Prior Publication Data

US 2022/0381812 A1 Dec. 1, 2022

(30) Foreign Application Priority Data

May 31, 2021 (JP) ................................ 2021-091490

(51) Int. Cl.
*G01R 31/12* (2020.01)
*G01R 31/52* (2020.01)
*G01R 27/26* (2006.01)
*G01R 27/02* (2006.01)

(52) U.S. Cl.
CPC ....... *G01R 31/1227* (2013.01); *G01R 27/025* (2013.01); *G01R 27/2605* (2013.01); *G01R 31/12* (2013.01); *G01R 31/52* (2020.01)

(58) Field of Classification Search
CPC ...... G01R 27/00; G01R 27/02; G01R 27/025; G01R 27/26; G01R 27/2605; G01R 31/00; G01R 31/12; G01R 31/50; G01R 31/52; G01R 31/1227

USPC ................. 324/160, 162, 500, 509
See application file for complete search history.

(56) References Cited

U.S. PATENT DOCUMENTS

| | | | | |
|---|---|---|---|---|
| 10,613,156 | B2* | 4/2020 | Kawamura | ........... B60L 3/0069 |
| 11,493,564 | B2* | 11/2022 | Takamatsu | ............. G01R 31/12 |
| 2019/0086464 | A1* | 3/2019 | Kawamura | ........... G01R 27/025 |
| 2020/0064388 | A1* | 2/2020 | Kawamura | ............ G01R 31/50 |
| 2020/0191881 | A1* | 6/2020 | Kawamura | .............. H02J 7/345 |
| 2020/0319261 | A1* | 10/2020 | Kawamura | ............ G01R 31/52 |
| 2020/0386827 | A1* | 12/2020 | Takamatsu | ......... G01R 31/3835 |
| 2021/0129675 | A1* | 5/2021 | Isaksson | ................. B60R 16/03 |
| 2022/0381812 | A1* | 12/2022 | Mochizuki | ........... G01R 27/025 |

FOREIGN PATENT DOCUMENTS

JP 2014-126382 A 7/2014

* cited by examiner

*Primary Examiner* — Hoai-An D. Nguyen
(74) *Attorney, Agent, or Firm* — Sughrue Mion, PLLC

(57) ABSTRACT

An earth fault detection apparatus includes a switch group configured to switch between a first measurement path including a battery and a capacitor, and a second and third measurement paths including the battery, a positive/negative-side insulation resistance, and the capacitor; a reference resistance and a test switch; and a control unit calculating a first reference value based on each charging voltage in a case where the test switch is opened and the capacitor is charged, and calculating the insulation resistance with reference to a conversion map created to correspond to an electrostatic capacitance between a power supply line and ground, wherein the control unit calculates a second reference value based on each charging voltage in a case where the test switch is closed and the capacitor is charged for a shorter time, and estimates the electrostatic capacitance with reference to a predetermined test conversion map.

2 Claims, 5 Drawing Sheets

| | CAPACITANCE OF Y CAPACITOR | | | | | | | | |
|---|---|---|---|---|---|---|---|---|---|
| | CAPACITANCE C1 | CAPACITANCE C2 | CAPACITANCE C3 | CAPACITANCE C4 | CAPACITANCE C5 | CAPACITANCE C6 | CAPACITANCE C7 | CAPACITANCE C8 | CAPACITANCE C9 |
| REFERENCE VALUE P1 | 577 | 578 | 583 | 588 | 593 | 599 | 604 | 610 | 612 |
| REFERENCE VALUE P2 | 585 | 587 | 592 | 597 | 602 | 608 | 614 | 620 | 622 |
| REFERENCE VALUE P3 | 594 | 596 | 601 | 606 | 612 | 618 | 624 | 631 | 632 |
| REFERENCE VALUE P4 | 603 | 605 | 610 | 616 | 622 | 628 | 634 | 641 | 643 |
| REFERENCE VALUE P5 | 612 | 614 | 620 | 626 | 632 | 638 | 645 | 652 | 654 |
| REFERENCE VALUE P6 | 622 | 623 | 629 | 635 | 642 | 649 | 656 | 663 | 665 |
| REFERENCE VALUE P7 | 631 | 633 | 639 | 645 | 652 | 659 | 666 | 674 | 676 |
| REFERENCE VALUE P8 | 641 | 643 | 649 | 656 | 663 | 670 | 678 | 685 | 687 |
| REFERENCE VALUE P9 | 651 | 653 | 659 | 666 | 673 | 681 | 689 | 697 | 699 |
| REFERENCE VALUE P10 | 661 | 663 | 670 | 677 | 684 | 692 | 700 | 709 | 711 |
| REFERENCE VALUE P11 | 671 | 673 | 680 | 688 | 695 | 704 | 712 | 721 | 723 |
| REFERENCE VALUE P12 | 682 | 683 | 691 | 699 | 707 | 715 | 724 | 734 | 736 |
| REFERENCE VALUE P13 | 692 | 694 | 702 | 710 | 718 | 727 | 737 | 746 | 749 |
| REFERENCE VALUE P14 | 703 | 705 | 713 | 722 | 730 | 740 | 749 | 759 | 762 |
| REFERENCE VALUE P15 | 714 | 716 | 725 | 733 | 742 | 752 | 762 | 773 | 775 |
| REFERENCE VALUE P16 | 725 | 728 | 736 | 745 | 755 | 765 | 775 | 786 | 789 |
| REFERENCE VALUE P17 | 737 | 739 | 748 | 758 | 767 | 778 | 789 | 800 | 803 |
| REFERENCE VALUE P18 | 749 | 751 | 760 | 770 | 780 | 791 | 803 | 814 | 818 |
| REFERENCE VALUE P19 | 761 | 763 | 773 | 783 | 794 | 805 | 817 | 829 | 832 |
| REFERENCE VALUE P20 | 773 | 775 | 785 | 796 | 807 | 819 | 831 | 844 | 847 |

FIG.2

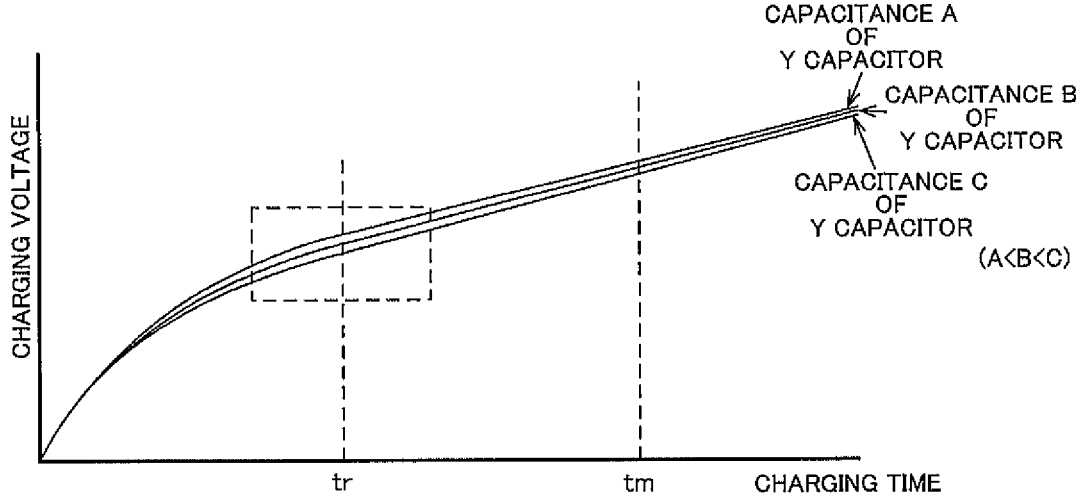

FIG.3

| | CAPACITANCE OF Y CAPACITOR | | | | | | | | |
|---|---|---|---|---|---|---|---|---|---|
| | CAPACITANCE C1 | CAPACITANCE C2 | CAPACITANCE C3 | CAPACITANCE C4 | CAPACITANCE C5 | CAPACITANCE C6 | CAPACITANCE C7 | CAPACITANCE C8 | CAPACITANCE C9 |
| REFERENCE VALUE Q1 | 387 | 390 | 402 | 417 | 433 | 450 | 470 | 493 | 499 |
| REFERENCE VALUE Q2 | 403 | 406 | 420 | 436 | 453 | 473 | 495 | 521 | 528 |
| REFERENCE VALUE Q3 | 419 | 423 | 438 | 456 | 475 | 497 | 522 | 551 | 559 |
| REFERENCE VALUE Q4 | 437 | 441 | 458 | 477 | 498 | 523 | 551 | 584 | 593 |
| REFERENCE VALUE Q5 | 456 | 460 | 478 | 500 | 524 | 551 | 583 | 620 | 630 |
| REFERENCE VALUE Q6 | 475 | 480 | 500 | 524 | 551 | 581 | 617 | 660 | 671 |
| REFERENCE VALUE Q7 | 496 | 501 | 524 | 550 | 580 | 614 | 655 | 703 | 717 |
| REFERENCE VALUE Q8 | 518 | 524 | 549 | 578 | 611 | 650 | 696 | 752 | 767 |
| REFERENCE VALUE Q9 | 541 | 548 | 576 | 608 | 645 | 689 | 742 | 806 | 824 |
| REFERENCE VALUE Q10 | 566 | 573 | 604 | 640 | 682 | 732 | 793 | 867 | 888 |
| REFERENCE VALUE Q11 | 593 | 601 | 635 | 675 | 723 | 780 | 849 | 936 | 961 |
| REFERENCE VALUE Q12 | 621 | 630 | 663 | 713 | 767 | 832 | 913 | 1015 | 1044 |
| REFERENCE VALUE Q13 | 652 | 661 | 704 | 755 | 816 | 891 | 985 | 1106 | 1141 |
| REFERENCE VALUE Q14 | 685 | 695 | 743 | 800 | 870 | 956 | 1067 | 1212 | 1255 |
| REFERENCE VALUE Q15 | 720 | 732 | 785 | 850 | 930 | 1031 | 1162 | 1337 | 1391 |
| REFERENCE VALUE Q16 | 758 | 771 | 831 | 905 | 997 | 1115 | 1272 | 1488 | 1555 |
| REFERENCE VALUE Q17 | 799 | 814 | 882 | 966 | 1073 | 1213 | 1402 | 1671 | 1758 |
| REFERENCE VALUE Q18 | 844 | 861 | 938 | 1035 | 1160 | 1326 | 1557 | 1902 | 2015 |
| REFERENCE VALUE Q19 | 893 | 912 | 1000 | 1112 | 1259 | 1459 | 1747 | 2197 | 2352 |

FIG.4

EARTH FAULT DETECTION APPARATUS

BACKGROUND

Technical Field

The present invention relates to an earth fault detection apparatus using a flying capacitor.

Related Art

In a vehicle such as a hybrid vehicle including an engine and an electric motor as driving sources or an electric vehicle, a battery equipped in a vehicle body is charged to generate propulsive force with use of electric energy supplied from the battery. A battery-related power supply circuit is typically configured as a high-voltage circuit that handles a high voltage equal to or higher than 200 V. In order to ensure its safety, the high-voltage circuit including a battery has a non-grounded configuration electrically insulated from the vehicle body, which serves as a reference potential point of grounding.

In a vehicle equipped with a non-grounded high-voltage battery, an earth fault detection apparatus is provided to monitor an insulation state (earth fault) between the vehicle body and a system provided with the high-voltage battery, specifically, a main power supply system from the high-voltage battery to a motor. As the earth fault detection apparatus, a method of using a capacitor called a flying capacitor is widely used.

In order to obtain knowledge about an insulation resistance, the earth fault detection apparatus of a flying capacitor type selectively switches measurement paths via switches, each of the measurement paths including a detection capacitor functioning as the flying capacitor, wherein the earth fault detection apparatus performs a V0 measurement, a Vc1n measurement, and a Vc1p measurement. Here, the V0 measurement is a measurement of a voltage corresponding to the voltage of the high-voltage battery. The Vc1n measurement is a measurement of a voltage reflecting influence of RLn, which is an insulation resistance on the negative side. The Vc1p measurement is a measurement of a voltage reflecting influence of RLp, which is an insulation resistance on the positive side.

It is known that the insulation resistance obtained by combining the insulation resistance on the positive side and the insulation resistance on the negative side together can be calculated from V0, Vc1n, and Vc1p that have been obtained through these measurements. The operation for the calculation is complicated. Hence, a conversion map for converting the insulation resistance with Vc1/V0 (where Vc1=Vc1p+Vc1n) as a reference value is generally prepared in advance. The insulation resistance is then estimated from the value of Vc1/V0 that has been obtained through the measurements with reference to the conversion map, and an occurrence of an earth fault is determined.

In any of the measurements of V0, Vc1n, and Vc1p, a charging voltage, at the time when the detection capacitor has been charged for a predetermined charging time $\Delta tm$, is measured and set as a measurement value. The charging time $\Delta tm$ is set to such a value that the detection capacitor is not fully charged in order to determine the earth fault in a short time. On the other hand, in a case where the charging time $\Delta tm$ is too short, the charging voltage decreases, and the detection accuracy decreases because of influences of noise and the like. For this reason, the charging time $\Delta tm$ is determined in consideration of the balance between the determination time and the detection accuracy, and can be, for example, about 1.2 seconds.

In order to remove high-frequency noise and stabilize the operation, by the way, a capacitor called a Y capacitor (line bypass capacitor) is connected between the positive and negative power supply lines of a high-voltage battery and a grounding electrode, in many cases. Note that in the present specification, it is assumed that a stray capacitance existing between the power supply line and the grounding electrode is considered to be also included in the Y capacitor.

Charges are exchanged between the Y capacitor and the detection capacitor when the measurement path is switched. Hence, the charging voltage of the detection capacitor may be affected by the Y capacitor, and the calculation accuracy of the insulation resistance may be degraded.

In a case where the capacitance of the Y capacitor is known, it is possible to prevent a decrease in the calculation accuracy of the insulation resistance by preparing a conversion map corresponding to the capacitance of the Y capacitor. However, the capacitance of the Y capacitor is unknown to the earth fault detection apparatus, and varies depending on a vehicle type, a situation, and the like.

JP 2014-126382 A describes that a plurality of conversion maps are prepared for every capacitance of the Y capacitor. A test mode is carried out in a state in which a reference resistance having a known resistance value is connected between the power supply line and the grounding electrode, so that a conversion map corresponding to an actual capacitance of the Y capacitor is selected.

Specifically, the insulation resistance is calculated in each conversion map with use of the reference value that has been obtained in the test mode, and the conversion map in which the value closest to the reference resistance has been obtained is selected. Then, in an actual measurement, the insulation resistance is calculated with use of the conversion map that has been selected in the test mode.

Patent Literature 1: JP 2014-126382 A

SUMMARY

In the invention described in JP 2014-126382 A, a known reference resistance is regarded as the insulation resistance in the test mode, and a conversion map in which a value closest to the reference resistance has been obtained is selected. However, not only the reference resistance but also the combined resistance of the reference resistance, an insulation resistance RLn, and an insulation resistance RLp function as the insulation resistance in the test mode, and an actual insulation resistance also influences. In particular, the influence increases, while the actual insulation resistance is decreasing.

In addition, in these years, there are vehicles in which a high-voltage battery and a fuel cell are both used. In such vehicles, an insulation resistance between the fuel cell and the ground is also added in parallel. Hence, divergence between the insulation resistance and the reference resistance further increases in the test mode.

Accordingly, the capacitance of the Y capacitor corresponding to the conversion map and having the obtained value closest to the reference resistance does not always approximate to the actual capacitance of the Y capacitor, and may adversely affect the calculation accuracy of the insulation resistance.

Therefore, the present invention has an object to improve estimation accuracy of an electrostatic capacitance between a power supply line and the ground in an earth fault detection apparatus of a flying capacitor type.

In order to address the above issues, an earth fault detection apparatus in the present invention is an earth fault detection apparatus to be connected with a non-grounded battery and for calculating an insulation resistance of a system including the battery, the earth fault detection apparatus including:

a capacitor configured to be operated as a flying capacitor;

a switch group configured to switch between a first measurement path, a second measurement path, and a third measurement path, the first measurement path including the battery and the capacitor, the second measurement path including the battery, a negative-side insulation resistance that is an insulation resistance between a negative-side line of the battery and ground, and the capacitor, the third measurement path including the battery, a positive-side insulation resistance that is an insulation resistance between a positive-side line of the battery and the ground, and the capacitor;

a reference resistance and a test switch connected in series between the ground and the positive-side line or the negative-side line of the battery; and a control unit configured to calculate a first reference value based on each charging voltage in a case where the test switch is opened and the capacitor is charged for a first time in each of the first to third measurement paths, and configured to calculate the insulation resistance with reference to a conversion map that has been created to correspond to an electrostatic capacitance between the positive-side line and the negative-side line of the battery and the ground, wherein the control unit calculates a second reference value based on each charging voltage in a case where the test switch is closed and the capacitor is charged for a second time in each of the first to third measurement paths, the second time being shorter than the first time, and configured to estimate the electrostatic capacitance with reference to a predetermined test conversion map.

According to the present invention, in the earth fault detection apparatus of the flying capacitor type, the estimation accuracy of the electrostatic capacitance between the power supply line and the ground can be improved.

BRIEF DESCRIPTION OF DRAWINGS

FIG. 2 is a diagram illustrating an example of a conversion map;

FIG. 3 is a diagram illustrating a relationship between a charging time and a charging voltage for each capacitance of a Y capacitor;

FIG. 4 is a diagram illustrating an example of the conversion map for a test mode;

DETAILED DESCRIPTION

Figure 1:
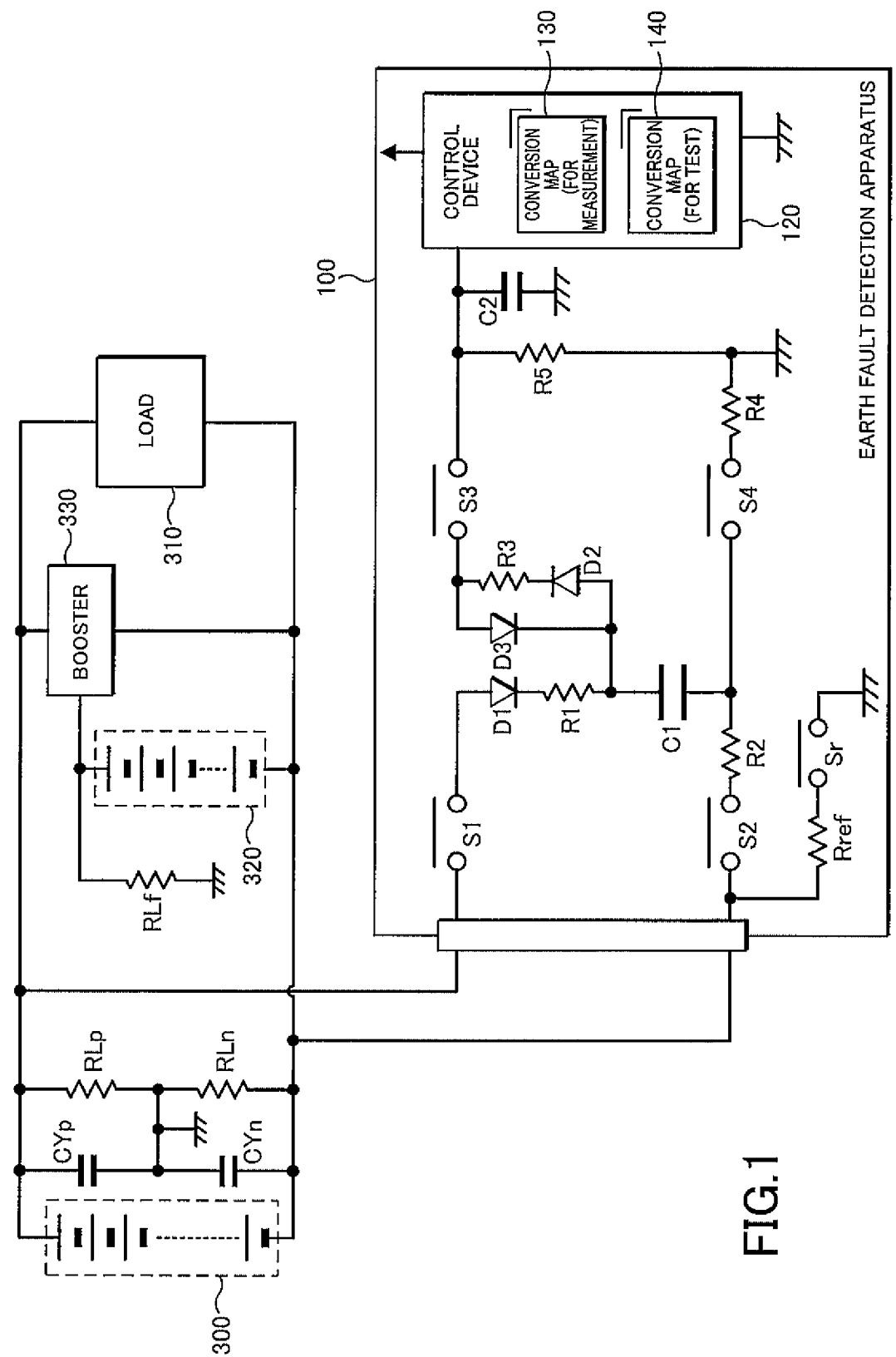
FIG. 1 is a block diagram illustrating a configuration of an earth fault detection apparatus according to an embodiment of the present invention.

Embodiments of the present invention will be described in detail with reference to the drawings. FIG. 1 is a block diagram illustrating a configuration of an earth fault detection apparatus 100 according to an embodiment of the present invention. As illustrated in the drawing, the earth fault detection apparatus 100 is an apparatus of a flying capacitor type that is connected with a high-voltage battery 300 and that detects an earth fault of a system provided with the high-voltage battery 300. Here, RLp represents an insulation resistance between the positive side of the high-voltage battery 300 and the ground, and RLn represents an insulation resistance between the negative side thereof and the ground.

The high-voltage battery 300 is a battery used for driving a vehicle to travel. The high-voltage battery 300 is configured with a rechargeable battery such as a lithium ion battery, and drives a load 310 including e.g. an electric motor.

In addition, in a high-voltage system in the present embodiment, a fuel cell 320 is provided in addition to the high-voltage battery 300. The fuel cell 320 is connected in parallel with the high-voltage battery 300 through a booster 330. In a case where RLf represents an insulation resistance between the positive electrode side of the fuel cell 320 and the ground, the insulation resistance of the high-voltage system has a value obtained by combining RLn, RLp, and RLf. It is needless to say that the present invention is also applicable to a high-voltage system that does not include the fuel cell 320, a high-voltage system including the fuel cell 320 instead of the high-voltage battery 300, and the like.

Capacitors CYp and CYn each called Y capacitor are respectively connected between a positive-side power supply line and a grounding electrode and between a negative-side power supply line and the grounding electrode of the high-voltage battery 300. Here, the stray capacitance between the power supply lines and the grounding electrode is considered to be also included in the capacitors CYp and CYn. The capacitance values of the capacitors CYp and CYn are unknown.

As illustrated in the drawing, the earth fault detection apparatus 100 includes a detection capacitor C1 that operates as a flying capacitor, and a control device 120. In addition, the earth fault detection apparatus 100 includes four switches S1 to S4 in the surroundings of the detection capacitor C1 in order to switch the measurement paths and to control charging and discharging of the detection capacitor C1. These switches each can be configured with an insulating switching element, such as an optical MOSFET.

The switch S1 has a first end connected with a positive-side power supply line and a second end connected with an anode side of a diode D1. A cathode side of the diode D1 is connected with a first end of a resistor R1, and a second end of the resistor R1 is connected with a first pole of the detection capacitor C1. The switch S2 has a first end connected with a negative-side power supply line and a second end connected with a first end of a resistor R2. A second end of the resistor R2 is connected with a second pole of the detection capacitor C1.

The switch S3 has a first end connected with a first end of a resistor R3 and an anode side of a diode D3, and a second end connected with a first end of a resistor R5, an analog input terminal of the control device 120, and a first pole of a capacitor C2 having a second pole that is grounded. A cathode side of the diode D3 is connected with the first pole of the detection capacitor C1, a second end of the resistor R3 is connected with a cathode side of a diode D2, and an anode side of the diode D2 is connected with the first pole of the detection capacitor C1. A second end of a resistor R5 is grounded. The switch S4 has a first end connected with the second pole of the detection capacitor C1 and a second end connected with a first end of a resistor R4. A second end of the resistor R4 is grounded.

The control device 120 is configured with a microcomputer or the like, and executes a program that has been incorporated beforehand to conduct various types of control required for the earth fault detection apparatus 100. Specifically, the control device 120 controls the switches S1 to S4 to switch the measurement paths individually, and also controls charging and discharging of the detection capacitor C1.

The respective measurement circuits for the V0 measurement, the Vc1n measurement, and the Vc1p measurement are similar to those in the related art. That is, in the V0 measurement, the switches S1 and S2 are turned on to charge the detection capacitor C1. In the Vc1n measurement, the switches S1 and S4 are turned on to charge the detection capacitor C1. In the Vc1p measurement, the switches S2 and S3 are turned on to charge the detection capacitor C1.

In addition, the control device 120 receives an input of an analog level corresponding to the charging voltage of the detection capacitor C1 from an analog input terminal, wherein the analog level serves as a measurement value. A decrease in the insulation resistance of the system provided with the high-voltage battery 300 is detected based on such a measurement value. When the charging voltage for the detection capacitor C1 is applied to the analog input terminal, the switches S3 and S4 are turned on. In this path, the detection capacitor C1 is also discharged.

The above description relates to a basic circuit configuration widely used in the earth fault detection apparatus of a flying capacitor type. However, the earth fault detection apparatus of the flying capacitor type has various modifications. The configuration of the earth fault detection apparatus 100 is not limited to the example in the drawing.

In the present embodiment, the control device 120 further includes a measurement conversion map 130 used for measurement and a test conversion map 140 used for test. The measurement conversion map 130 is a conversion map used in an actual earth fault detection process. The test conversion map 140 is a conversion map used in a test mode for estimating the capacitance of the Y capacitor. Both conversion maps are created for each capacitance of the Y capacitor. For example, the capacitances can be classified into a plurality of groups in accordance with its magnitude, and the conversion map can be created for each group.

In addition, a reference resistance Rref and a test switch Sr are connected in series with each other between the negative-side power supply line and the ground. The resistance value of the reference resistance Rref is known, and the test switch Sr is switched to be closed by the control device 120 in the test mode. The reference resistance Rref and the test switch Sr may be connected between the positive-side power supply line and the ground.

In the test mode, the combined resistance of the respective insulation resistances of RLp, RLn, and RLf and the reference resistance Rref becomes an insulation resistance value at the time of the test. In this state, V0, Vc1n, and Vc1p are measured to calculate a reference value. The reference value is applied to each test conversion map 140 that has been created for each capacitance of the Y capacitor, and the insulation resistance is calculated.

Then, among the insulation resistances that have been obtained, the capacitance of the Y capacitor corresponding to the conversion map that is assumed to be closest to the insulation resistance value at the time of the test is estimated to be an actual capacitance of the Y capacitor. Then, in the actual earth fault detection process, the insulation resistance is calculated with reference to the measurement conversion map 130 corresponding to the capacitance of the Y capacitor that has been estimated.

Here, a precondition in the earth fault detection process is assumed. In a normal state in which no earth fault is occurring, the respective insulation resistances of RLp, RLn, and RLf are sufficiently large. It is assumed that in a case where the value in such a state is 4.8 MΩ, the combined insulation resistance (RLp//RLn//RLf) is 1.6 MΩ.

In order to set the value of the reference resistance Rref to be smaller than the normal insulation resistance, the value is set to 1350 kΩ here. In this situation, when the reference resistance Rref is connected in the test mode, the combined resistance (RLp//RLn//RLf//Rref) of the normal insulation resistance and the reference resistance is 736 kΩ. This value can be considered as the maximum value of the insulation resistance value at the time of the test.

On the other hand, each insulation resistance varies depending on various factors, and for example, any one of RLp, RLn, and RLf can be likely to decrease to 3.0 MΩ. In this situation, the combined insulation resistance is 1.3 MΩ. In the test mode, the combined resistance of the insulation resistance and the reference resistance is 668 kΩ. It is assumed that this value is the minimum value of the insulation resistance value at the time of the test.

That is, in the test mode, it can be assumed that the insulation resistance value at the time of the test varies between 668 kΩ and 736 kΩ depending on the situation of the insulation resistance.

In addition, the range of the capacitance of the Y capacitor can also be assumed to some extent for each vehicle type in accordance with a technical standard or the like. For example, it is assumed to vary between the capacitance C1 and the capacitance C9 (where C1<C9).

FIG. 2 illustrates an example of the measurement conversion map 130 that has been created for each one of the capacitances C1 to C9. It is possible to obtain the conversion map by calculating with the capacitance of the detection capacitor C1, the resistance in the measurement circuit, and the charging time, in addition to the capacitance of the Y capacitor. However, in the example of this drawing, the charging time is set as a charging time Δtm in the actual earth fault detection process. As described above, the charging time Δtm is determined in consideration of the balance between the determination time and the detection accuracy, and can be, for example, about 1.2 seconds. In addition, shaded regions in the drawing indicate 668 kΩ to 736 kΩ included in a variation range of the insulation resistance value at the time of the test.

For example, it is assumed that a reference value P12 is a reference value that has been obtained through the measurements of V0, Vc1n, and Vc1p in the test mode. In this situation, the insulation resistance value of each capacitance of the Y capacitor varies within the range of 682 kΩ to 736 kΩ, and all the insulation resistance values fall within the variation range of the insulation resistance value at the time of the test. Therefore, under this condition, it is impossible to select an insulation resistance value closest to the insulation resistance value at the time of the test, and it is impossible to estimate the capacitance of the Y capacitor.

As illustrated in FIG. 3, by the way, the charging voltage of the detection capacitor C1 is different in rising speed depending on the capacitance of the Y capacitor. Specifically, as the capacitance of the Y capacitor becomes smaller, the rise is steeper. This difference remarkably appears around a time tr indicated by a rectangular broken line in the drawing. A charging time Δtr is shorter than the charging time Δtm in the earth fault detection process, and can be set to, for example, about a half that is about 600 milliseconds.

The charging time Δtm cannot be shortened in order not to degrade the detection accuracy. Therefore, in the present embodiment, the charging time Δtr in the test mode is set to a value smaller than the charging time Δtm in the earth fault detection process. In the test mode, the accuracy of the obtained reference value is degraded by shortening the charging time Δtr. However, the insulation resistance calculated from the reference value is distributed in a wide range, and is advantageous in estimating the capacitance of the Y capacitor.

FIG. 4 illustrates an example of a test conversion map 140 that has been created for each one of the capacitances C1 to C9. The capacitance C1 to the capacitance C9 are similar to those in FIG. 2, but in the example of the drawing, the charging time is set to a charging time Δtr that is a half the charging time Δtm in the actual earth fault detection process. Shaded regions in the drawing indicate 668 kΩ to 736 kΩ included in the variation range of the insulation resistance value at the time of the test.

For example, it is assumed that a reference value Q10 is a reference value that has been obtained through the measurements of V0, Vc1n, and Vc1p with the charging time as Δtr in the test mode. In this situation, the insulation resistance value for each capacitance of the Y capacitor widely varies within the range of 566 kΩ to 888 kΩ. This is because the charging time is shortened, and thus a difference in the charging voltage in accordance with the capacitance of the Y capacitor remarkably appears.

Under the condition in which the charging time is shortened, the insulation resistance value at the time of the test widely varies. Therefore, it is possible to narrow down the capacitance of the Y capacitor corresponding to the insulation resistance value overlapping the variation range of the insulation resistance value at the time of the test. Therefore, the estimation accuracy of the capacitance of the Y capacitor can be improved. As a result, a conversion map suitable for the actual situation is selectable, and the calculation accuracy of the insulation resistance can also be improved.

In the example of the drawing, the capacitance of the Y capacitor can be specified to the capacitance C5 or the capacitance C6. In the actual earth fault detection process, the measurement is performed at the charging time Δtm, and regarding the reference value that has been obtained, it is possible to obtain the insulation resistance with reference to the measurement conversion map 130 corresponding to the capacitance C5 or the capacitance C6.

Next, an operation of the earth fault detection apparatus 100 having the above configuration will be described. As a prerequisite, the measurement conversion map 130 is created for each capacitance of the Y capacitor with the charging time as the charging time Δtm, and the test conversion map 140 is created for each capacitance of the Y capacitor with the charging time as the charging time Δtr, which is shorter than the charging time Δtm.

Figure 5:
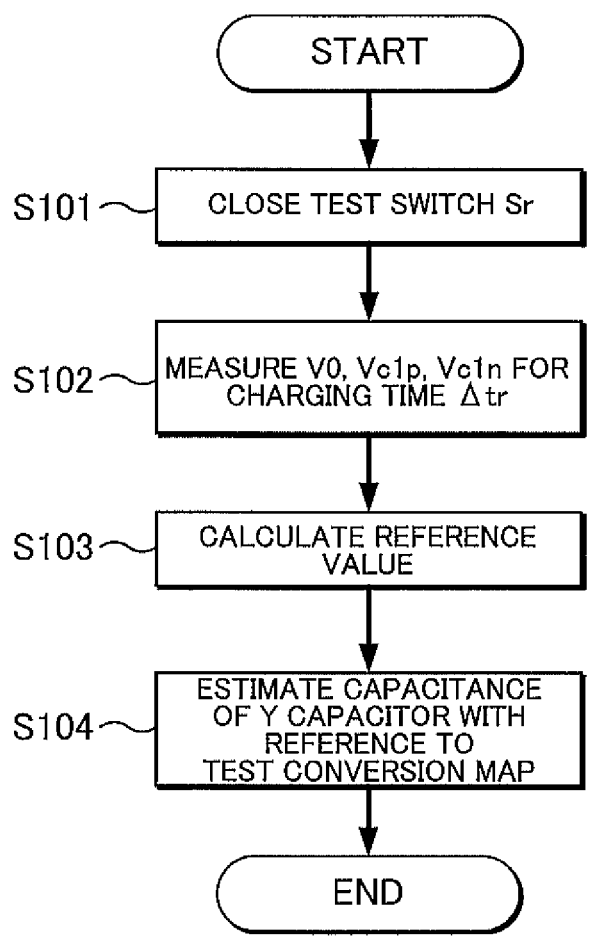
FIG. 5 is a flowchart for describing an operation of the earth fault detection apparatus in the test mode.

First, an operation of the earth fault detection apparatus 100 in the test mode will be described with reference to a flowchart in FIG. 5. The test mode is controlled by the control device 120, and can be performed, for example, at the time of starting the vehicle or based on a predetermined instruction.

In the test mode, the test switch Sr is closed to connect the reference resistance Rref (S101).

In a state in which the reference resistance Rref is connected, openings and closings of the switches S1 to S4 are controlled, and V0, Vc1n, and Vc1p are respectively measured at the charging time Δtr (S102). The charging time Δtr is shorter than the charging time Δtm in the earth fault detection process.

Then, a reference value is calculated, based on V0, Vc1n, and Vc1p that have been obtained at the charging time Δtr (S103).

Regarding the reference value that has been calculated, the capacitance of the Y capacitor is estimated with reference to the test conversion map 140 (S104). Specifically, the insulation resistance based on the reference value is calculated for each conversion map for individual capacitances included in the test conversion map 140, and the capacitance corresponding to the insulation resistance overlapping the assumed test insulation resistance range at the time of the test is estimated as the capacitance of the Y capacitor.

Figure 6:
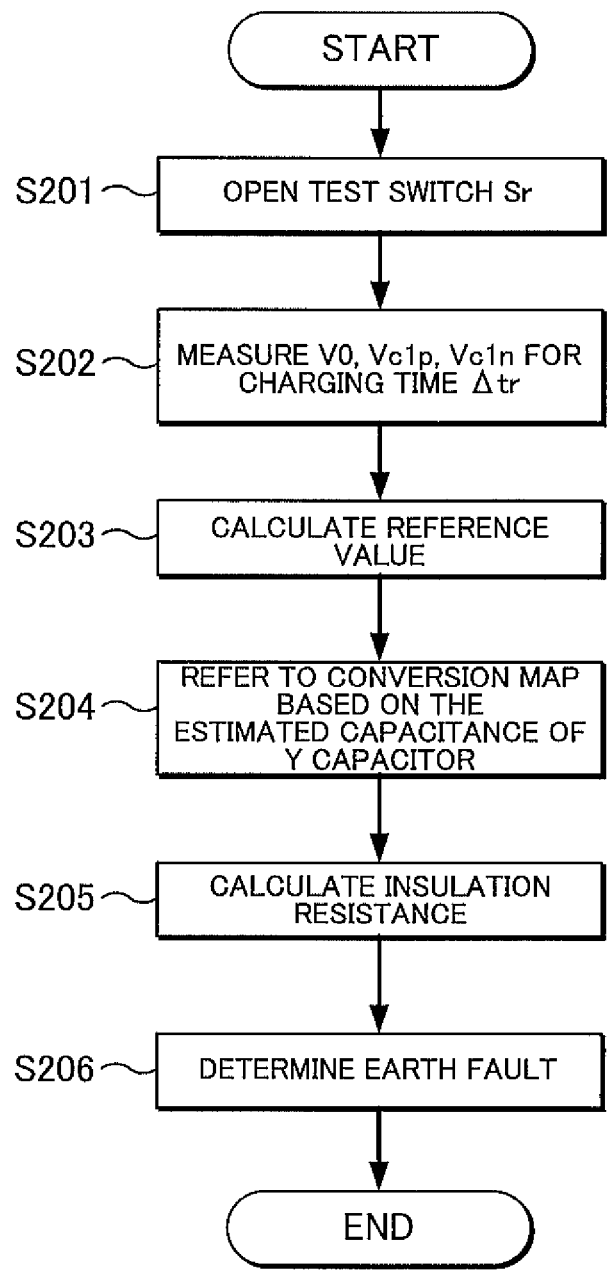
FIG. 6 is a flowchart for describing an earth fault determination process to be performed by the earth fault detection apparatus.

Next, an operation of the earth fault detection apparatus 100 in an actual earth fault detection process will be described with reference to a flowchart in FIG. 6. The earth fault detection process is controlled by the control device 120, and can be appropriately performed, for example, while the vehicle is in operation.

In the earth fault detection process, the test switch Sr is opened to disconnect the reference resistance Rref (S201).

Openings and closings of the switches S1 to S4 are controlled, and V0, Vc1n, and Vc1p are respectively measured at a normal charging time Δtm (S202).

A reference value is calculated, based on V0, Vc1n, and Vc1p that have been obtained at the charging time Δtm (S203).

With reference to the measurement conversion map 130 corresponding to the capacitance of the Y capacitor that has been estimated in the test mode (S204), the insulation resistance based on the calculated reference value is calculated (S205).

The earth fault determination is conducted, based on the calculated insulation resistance, in accordance with a given technical standard (S206).

As described heretofore, in the earth fault detection apparatus 100 in the present embodiment, the charging time in the test mode is made shorter than the charging time of the actual earth fault detection process, so that the capacitance of the Y capacitor can be easily narrowed down, and the estimation accuracy of the capacitance of the Y capacitor can be improved. As a result, a conversion map suitable for the actual situation is selectable, and the calculation accuracy of the insulation resistance can also be improved.

REFERENCE SIGNS LIST

100 Earth fault detection apparatus
120 Control device
130 Conversion map (for measurement)
140 Conversion map (for test)
300 High-voltage battery
310 Load
320 Fuel cell
330 Booster

What is claimed is:

1. An earth fault detection apparatus to be connected with a non-grounded battery and for calculating an insulation resistance of a system including the battery, the earth fault detection apparatus comprising:
a capacitor configured to be operated as a flying capacitor;
a switch group configured to switch between a first measurement path, a second measurement path, and a third measurement path, the first measurement path including the battery and the capacitor, the second measurement path including the battery, a negative-side insulation resistance that is an insulation resistance between a negative-side line of the battery and ground, and the capacitor, the third measurement path including the battery, a positive-side insulation resistance that is an insulation resistance between a positive-side line of the battery and the ground, and the capacitor;

a reference resistance and a test switch connected in series between the positive-side line or the negative-side line of the battery and the ground; and a control unit configured to calculate a first reference value based on each charging voltage in a case where the test switch is opened and the capacitor is charged for a first time in each of the first to third measurement paths, and configured to calculate the insulation resistance with reference to a conversion map that has been created to correspond to an electrostatic capacitance between the ground and each of the positive-side line and the negative-side line of the battery, wherein the control unit calculates a second reference value based on each charging voltage in a case where the test switch is closed and the capacitor is charged for a second time in each of the first to third measurement paths, the second time being shorter than the first time, and configured to estimate the electrostatic capacitance with reference to a predetermined test conversion map.

2. The earth fault detection apparatus according to claim 1, wherein the test conversion map indicates a resistance value with respect to the second reference value for each electrostatic capacitance, and the control unit configured to estimate the electrostatic capacitance, based on a range of a resistance value to be assumed as a combined resistance of the insulation resistance and the reference resistance, and a resistance value with respect to the second reference value for each electrostatic capacitance.

* * * * *